US011758716B2

(12) United States Patent
Saxler

(10) Patent No.: US 11,758,716 B2
(45) Date of Patent: Sep. 12, 2023

(54) ELECTRONIC DEVICES INCLUDING VERTICAL MEMORY CELLS AND RELATED METHODS

(71) Applicant: Micron Technology, Inc., Boise, ID (US)

(72) Inventor: Adam W. Saxler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/555,033

(22) Filed: Aug. 29, 2019

(65) Prior Publication Data

US 2020/0075617 A1 Mar. 5, 2020

Related U.S. Application Data

(60) Provisional application No. 62/727,367, filed on Sep. 5, 2018.

(51) Int. Cl.
*H01L 27/06* (2006.01)
*H10B 41/27* (2023.01)
*H10B 41/35* (2023.01)

(52) U.S. Cl.
CPC ......... *H10B 41/27* (2023.02); *H01L 27/0605* (2013.01); *H10B 41/35* (2023.02)

(58) Field of Classification Search
CPC ......... H01L 27/11273; H01L 27/11556; H01L 27/11582; H01L 27/0605; H01L 27/11524; H01L 27/108–10897; H01L 2924/1436–14369; H01L 27/1023; H01L 28/40–92; G11C 11/401–4099; G11C 14/0009–0045; G11C 2211/4016
See application file for complete search history.

(56) References Cited

U.S. PATENT DOCUMENTS

| | | | |
|---|---|---|---|
| 6,534,395 B2 | 3/2003 | Werkhoven et al. | |
| 8,039,854 B2 | 10/2011 | Hersee et al. | |
| 9,711,524 B2 | 7/2017 | Shoji et al. | |
| 9,806,203 B2 | 10/2017 | Then et al. | |
| 9,818,801 B1 | 11/2017 | Rabkin et al. | |
| 2014/0117412 A1* | 5/2014 | Werner | H01L 29/0808 257/197 |
| 2016/0035886 A1* | 2/2016 | Chen | H01L 29/66666 257/329 |
| 2016/0172296 A1* | 6/2016 | Lim | H01L 23/485 257/773 |
| 2016/0358933 A1* | 12/2016 | Rabkin | H01L 21/0214 |
| 2017/0054036 A1* | 2/2017 | Dorhout | H01L 29/7827 |
| 2019/0019809 A1* | 1/2019 | Lee | H10B 43/40 |
| 2019/0103411 A1* | 4/2019 | Liu | H01L 27/11568 |
| 2019/0109222 A1* | 4/2019 | Liu | H03F 3/211 |
| 2019/0214402 A1* | 7/2019 | Lin | H01L 27/1157 |
| 2019/0319100 A1* | 10/2019 | Chen | H01L 21/02236 |

* cited by examiner

*Primary Examiner* — Moin M Rahman
*Assistant Examiner* — Mohammad A Rahman
(74) *Attorney, Agent, or Firm* — TraskBritt

(57) ABSTRACT

An electronic device comprises an array of memory cells comprising a channel material laterally proximate to tiers of alternating conductive materials and dielectric materials. The channel material comprises a heterogeneous semiconductive material varying in composition across a width thereof. Related electronic systems and methods are also disclosed.

29 Claims, 10 Drawing Sheets

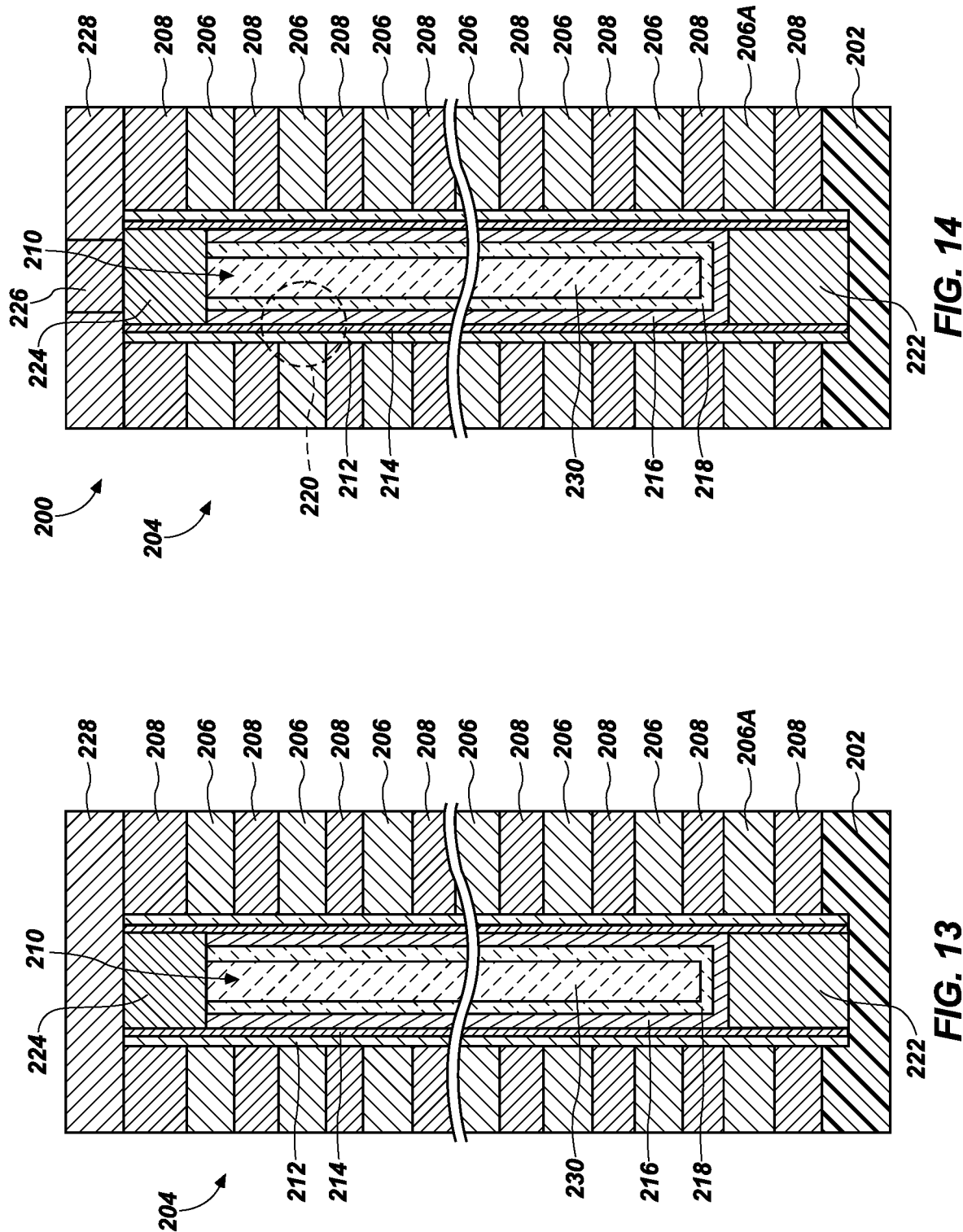

ELECTRONIC DEVICES INCLUDING VERTICAL MEMORY CELLS AND RELATED METHODS

CROSS-REFERENCE TO RELATED APPLICATION

This application claims the benefit under 35 U.S.C. § 119(e) of U.S. Provisional Patent Application Ser. No. 62/727,367, filed Sep. 5, 2018, the disclosure of which is hereby incorporated herein in its entirety by this reference.

TECHNICAL FIELD

Embodiments of the disclosure relate to the field of semiconductor device design, including vertical memory cells, and fabrication. More specifically, embodiments of the disclosure relate to heterogeneous channel materials, and to related electronic devices, electronic systems, and methods.

BACKGROUND

A NAND Flash memory device is a common type of Flash memory device, so called for the logical form in which the basic memory cell configuration is arranged. Common uses for Flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive materials (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Increasing memory density may be achieved by increasing an aspect ratio (i.e., depth to width ratio) and decreasing a width of openings formed in the tiers of conductive and dielectric materials. However, as the aspect ratio of the openings increases and width of the openings decreases, deposition of one or more material within the high aspect ratio openings decreases in quality. For example, one or more materials within the openings may be conformally deposited but, due to the high aspect ratio and narrow width, the materials deposited may suffer from poor step coverage having inconsistent coverage and dimensions (e.g., thickness, width) as the one or more materials extend along a sidewall of the openings.

BRIEF DESCRIPTION OF THE DRAWINGS

FIGS. 3-14 are cross-sectional side views illustrating a method of forming a memory device including vertical strings of memory cells, at various stages of the method, according to embodiments of this disclosure.

DETAILED DESCRIPTION

Figure 1:
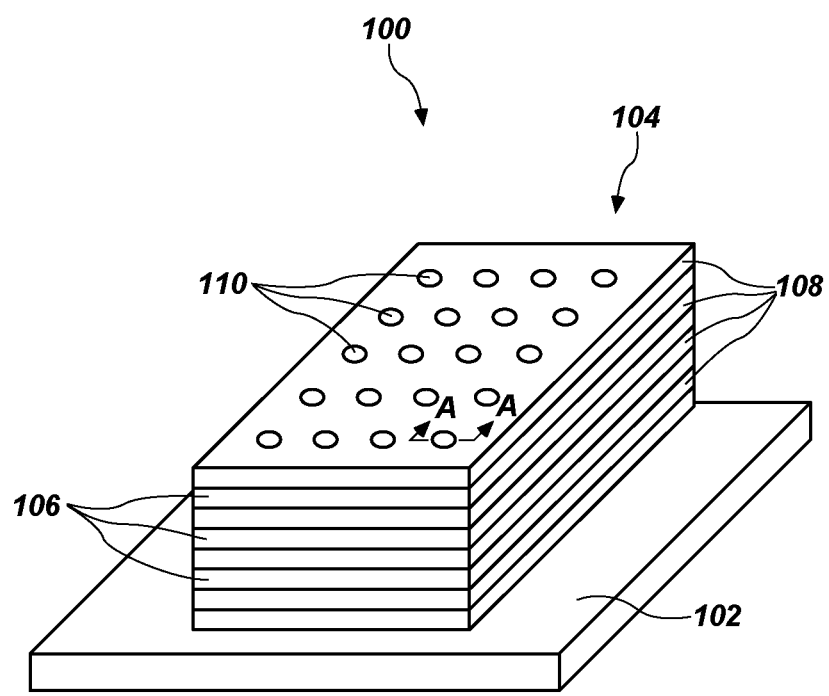
FIG. 1 is a perspective view of a portion of a memory device including a memory block over a substrate according to embodiments of this disclosure.

The illustrations included herewith are not meant to be actual views of any particular systems or structures, but are merely idealized representations that are employed to describe embodiments of the disclosure. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure, a tool used during processing of a semiconductor device structure, or a complete description of a process flow for fabricating a semiconductor device. The structures described below do not form complete semiconductor device structures, or tools or systems for processing semiconductor device structures. Only those process acts and structures necessary to understand the embodiments described herein are described in detail below. Additional acts to form a complete semiconductor device structure or a tool or system for processing a semiconductor device structure may be performed by conventional techniques.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, even at least 99.9% met, or even 100.0% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way. As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically-neighboring" or "longitudinally-neighboring" features (e.g., structures, devices) means and includes features located vertically proximate to one another. In addition, as used herein, "horizontally-neighboring" or "laterally-neighboring" features (e.g., structures, devices) means and includes features located horizontally proximate to one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

Electronic devices (e.g., semiconductor devices, memory devices) including heterogeneous channels are described, as are related electronic systems and methods of forming semiconductor devices. FIG. 1 illustrates a portion of an electronic device (e.g., a semiconductor device, a memory device 100) according to embodiments of the disclosure that includes a substrate 102 and a stack 104 of alternating conductive gate materials 106 and dielectric materials 108 over the substrate 102. Vertical channels 110 may be arranged in an array and extend vertically through the stack 104 of conductive gate materials 106 and dielectric materials 108. For clarity, peripheral portions, connections (e.g., a so-called "stair-step structure"), contacts, data lines (e.g., bit lines), surrounding insulating material, and other materials and structures of the memory device are not shown in FIG. 1. However, one of ordinary skill in the art will, upon consideration of this disclosure, understand how such other materials and structures may be used to provide a complete memory device 100.

Figure 2B:
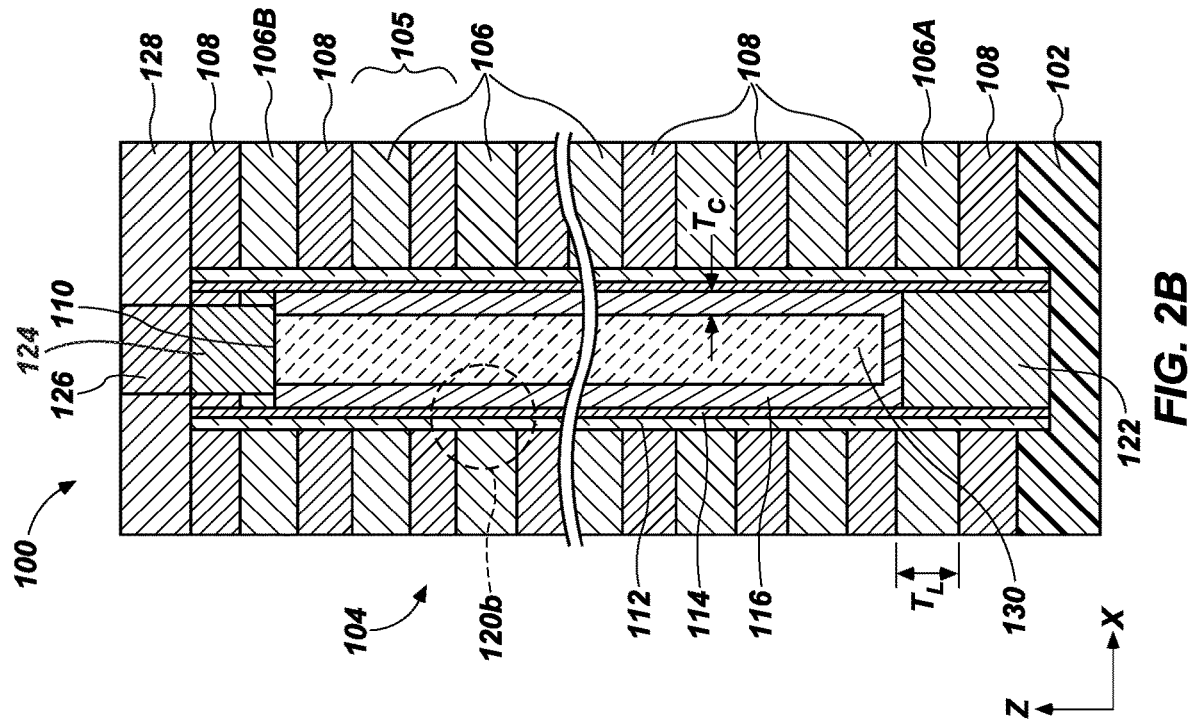
FIGS. 2A through 2C are cross-sectional side views of a vertical string of memory cells of a memory device according to embodiments of this disclosure, taken at section line A-A of FIG. 1.
Figure 2A:
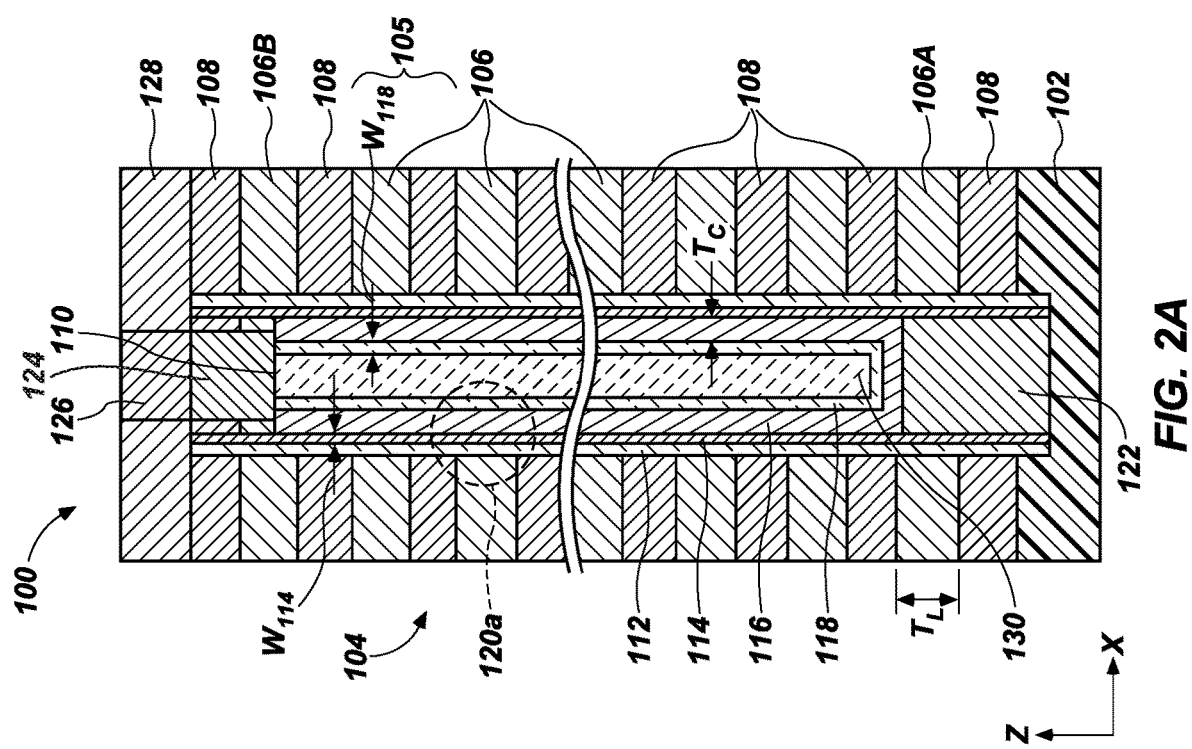
Figure 2C:
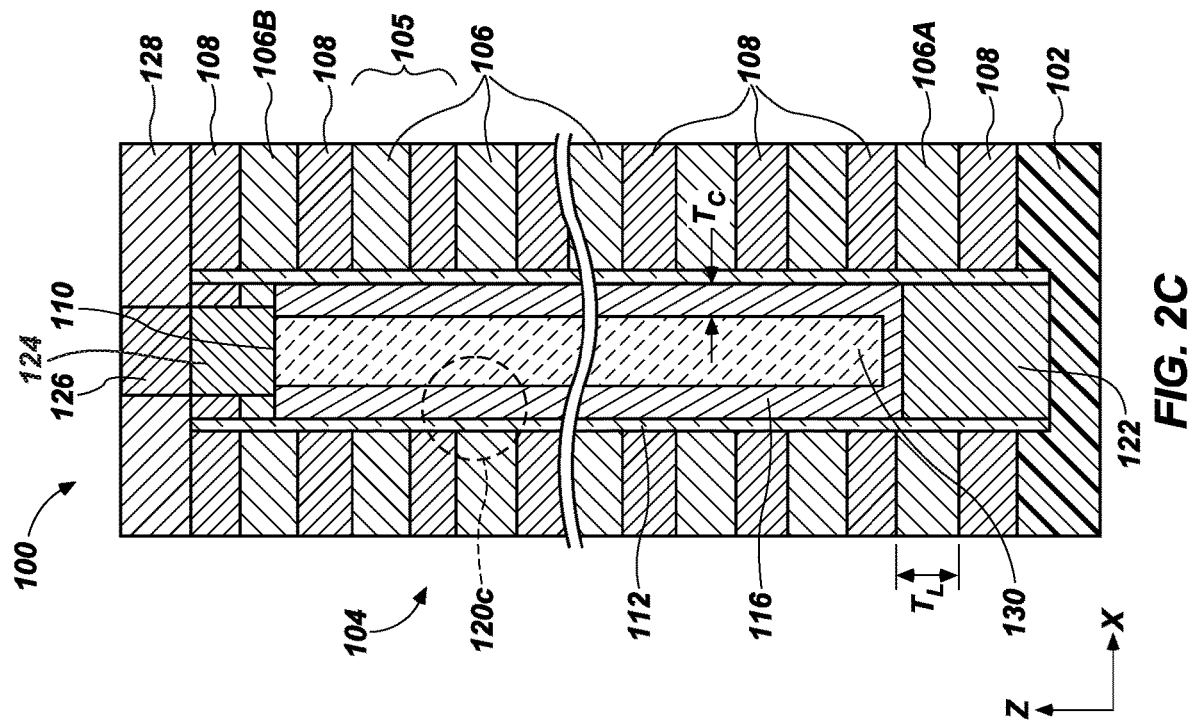

FIGS. 2A through 2C illustrate cross-sectional side views of the memory device 100 taken along the cross-sectional line A-A (FIG. 1) through one of the vertical channels 110 extending vertically (e.g., in the Z-direction) through the stack 104 and the underlying substrate 102 according to embodiments of the disclosure. A gate dielectric material 112 may be positioned along a sidewall of and within the vertical channel 110, in contact with the stack 104 of alternating conductive gate materials 106 and dielectric materials 108 arranged in tiers 105. Each of the tiers 105 may include one of the conductive gate materials 106 and one of the dielectric materials 108. An optional barrier material 114 may be positioned adjacent to, inside, and on (e.g., in contact with) or over the gate dielectric material 112. A channel material 116 may be positioned adjacent to, inside, and on or over the barrier material 114. The barrier material 114 may be selected to comprise a material having a band gap different than a band gap of a material of the channel material 116. In some embodiments, the barrier material 114 comprises a material having a higher (e.g., wider) band gap than a material of the channel material 116. Accordingly, an interface between the barrier material 114 and the channel material 116 is referred to in the art as a so-called "heterojunction."

The memory device 100 may, optionally, further comprise another barrier material 118. The another barrier material 118 may be positioned adjacent to, inside, and on or over the channel material 116. Like the barrier material 114, the another barrier material 118 may be selected to comprise a material having a band gap different than a band gap of the material of the channel material 116. In some embodiments, the another barrier material 118 comprises a material having a higher (e.g., wider) band gap than the material of the channel material 116. The barrier material 114 and the another barrier material 118 are formulated and configured to confine charge carriers (e.g., electrons) to the channel material 116. Increasing the carrier confinement ability of the memory device 100 may improve (e.g., increase) the pinch-off characteristics and reduce off-state leakage of the transistor. Further, the barrier material 114 and the another barrier material 118 are formulated and configured to serve as a source of charge carriers (e.g., electrons) to the channel material 116 and, as a result, may increase carrier mobility within the channel material 116. As discussed with later reference to FIGS. 2B and 2C, one or more of the barrier material 114 and the barrier material 118 may be optionally omitted.

Within and at a base of the vertical channel 110, a bottom plug material 122 may be located between the substrate 102 and the channel material 116 of the vertical channel 110. The bottom plug material 122 may be, or include, a material that exhibits a room temperature band gap of less than about 1.10 eV. By way of example and not limitation, the bottom plug material 122 may be or include silicon germanium (which has a room temperature band gap of about 0.85 eV), germanium (which has a room temperature band gap of about 0.66 eV), or indium gallium arsenide (which has a room temperature band gap of about 0.7 eV). The bottom plug material 122 may be doped with an n-type dopant.

The bottom plug material 122 may extend upward from the substrate 102 to at least partially vertically overlap a lowermost conductive gate material 106A. The lowermost conductive gate material 106A may have a vertical thickness $T_L$ that is greater than respective thicknesses of the other conductive gate materials 106 of the stack 104, to provide a larger margin of error when forming the bottom plug material 122 to at least partially vertically overlap the lowermost conductive gate material 106A. By way of example and not limitation, the vertical thickness $T_L$ of the lowermost conductive gate material 106A may be about 45 nm or greater, while the respective vertical thicknesses of the other conductive gate materials 106 may be about 35 nm.

Within and at a top portion of the vertical channel 110, a top plug material 124 may optionally be located between the channel material 116 and a data line 126 (e.g., a bit line). The top plug material 124 may at least partially vertically overlap an uppermost conductive gate material 106B.

One or more (e.g., from one to five) of the lowermost conductive gate materials 106, 106A may be configured as select gate sources. One or more (e.g., from one to five) of the uppermost conductive gate materials 106, 106B may be configured as select gate drains. The conductive gate materials 106 between the select gate source(s) and the select gate drain(s) may be configured as access lines (e.g., word lines). There may be any suitable number of access lines in the stack 104, such as about 32, about 64, about 72, about 96, or about 128, for example.

A cap dielectric material 128, which may include one or more different dielectric materials, may be positioned over the stack 104 of alternating conductive gate materials 106 and dielectric materials 108, adjacent to the data line 126 (e.g., the data line 126 may extend horizontally through the cap dielectric material 128).

An insulating material 130 may be positioned adjacent to and within sidewalls of the channel material 116 and/or the another barrier material 118, when present. The insulating material 130 may be formulated and configured to inhibit the flow of charges (e.g., electrons) therethrough. The insulating material 130 may be formed of one or more electrically insulative materials (e.g., a dielectric material), such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the insulating material 130 is silicon dioxide.

The channel material 116 may be, or include, a material that exhibits a room temperature band gap in a range extending from about 0.4 eV to about 6 eV or in a range extending from about 0.5 eV to about 4 eV. By way of example and not limitation, the channel material 116 may be or include a semiconductive material. The semiconductive material of the channel material 116 may be, or include, one or more of a metal nitride-containing material, a metal oxide-containing material, semiconductive sulfides (e.g., zinc sulfide, indium tin sulfide), semiconductive selenides ($CuIn_xGa_ySe_z$, commonly referred to as "CIGS"), semiconductive phosphides, semiconductive arsenides, semiconductive tellurides, and semiconductive antimonides (e.g., indium antimonide). Metal nitride-containing materials include, but are not limited to, boron nitride, aluminum nitride, gallium nitride, indium nitride, gallium arsenide nitride, aluminum gallium nitride, indium gallium nitride, aluminum gallium arsenide nitride, indium gallium arsenide nitride, and indium aluminum arsenide nitride. Metal oxide-containing materials include, but are not limited to, zinc oxide, indium oxide, tin oxide, gallium oxide, copper oxide (e.g., $CuMO_2$ where M is aluminum, gallium, indium, yttrium, scandium, chromium, lanthanum or a combination thereof), nickel oxide, titanium dioxide, hafnium oxide, zirconium dioxide, cadmium oxide, magnesium oxide, and indium tin oxide. The channel material 116 may comprise any Group III-V semiconductor material. By way of non-limiting example, the channel material 116 may comprise an oxide semiconductor material, such as zinc tin oxide ($Zn_xSn_yO$, commonly referred to as "ZTO"), indium zinc oxide ($In_xZn_yO$, commonly referred to as "IZO"), indium tin oxide ($In_xSn_yO_z$, commonly referred to as "ITO"), zinc oxide ($Zn_xO$), indium gallium zinc oxide ($In_xGa_yZn_zO$, commonly referred to as "IGZO"), indium gallium silicon oxide ($In_xGa_ySi_zO_a$, commonly referred to as "IGSO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), indium zinc oxide ($In_xZn_yO$), indium gallium zinc oxide ($In_xGa_yZn_zO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), indium aluminum gallium oxide ($In_xAl_yGa_zO_a$), indium aluminum gallium nitride ($In_xAl_yGa_zN$), silicon indium zinc oxide ($Si_xIn_yZn_zO$), zinc tin oxide ($Zn_xSn_yO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), indium gallium silicon oxide ($In_xGa_ySi_zO$), or a similar material. Formulae including at least one of "x", "y", "z", and "a" above (e.g., $Zn_xSn_yO$, $In_xZn_yO$, $In_xGa_yZn_zO$, $In_xGa_ySi_zO$, $Al_xSn_yIn_zZn_aO$) represent a composite material that contains an average ratio of "x" atoms of one element, "y" atoms of another element (if any), "z" atoms of an additional element (if any), and "a" atoms of a further element (if any) for every one atom of oxygen (O). As the formulae are representative of relative atomic ratios and not strict chemical structure, the semiconductor material 106 may comprise a stoichiometric compound or a non-stoichiometric compound, and values of "x," "y," "z," and "a" may be integers or may be non-integers. As used herein, the term "non-stoichiometric compound" means and includes a chemical compound with an elemental composition that cannot be represented by a ratio of well-defined natural numbers and is in violation of the law of definite proportions. The channel material 116 may include stoichiometric variations of the listed materials, and/or combinations of materials. The channel material 116 may be doped or undoped.

The barrier materials 114, 118, if present, may be, or include, a material that exhibits a room temperature band gap in a range extending from about 0.4 eV to about 6 eV or in a range extending from about 0.5 eV to about 4 eV. The barrier materials 114, 118 comprise a material having a higher (e.g., wider) band gap than a material of the channel material 116 such as a material having a band gap about 1.0 eV higher in band gap than the channel material 116. The barrier materials 114, 118 may be or include a semiconductive material. The semiconductive material of the barrier materials 114, 118 may be, or include, semiconductive materials of the channel material 116 as previously described herein. In some embodiments, the barrier materials 114, 118 may comprise stoichiometric variations of substantially the same compound of the channel material 116. By way of non-limiting example, the barrier materials 114, 118 may comprise aluminum gallium nitride or aluminum gallium oxide. At least one of the barrier materials 114, 118 may be delta-doped with, for example, silicon. As used herein, "delta doping" may mean or include doping that is localized or confined to a single atomic plane, or monolayer, which may also be referred to as atomic planar doping. In further embodiments, one or both of the barrier materials 114, 118 may be doped (e.g., n-doped, p-doped) to have a polarity opposite from that of the channel material 116 that may also be doped to enhance band bending adjacent the heterojunction to enhance confinement of charge carriers (e.g., electrons) to the channel material 116.

Each of the barrier materials 114, 118 may be configured as a liner having a sidewall width $W_{114}$, $W_{118}$, respectively. The sidewall width $W_{114}$, $W_{118}$ of the barrier materials 114, 118 may respectively be less than about 5.0 nm, such as extending in a range from about 0.3 nm to about 5.0 nm, or may be about 2.0 nm.

As previously discussed herein, one or more of the barrier materials 114, 118 is optionally present. With reference to FIG. 2A, the vertical channel 110 includes each of the barrier material 114, the channel material 116, and the another barrier material 118. In some embodiments, the barrier material 114 may extend along internal sidewalls of the gate dielectric material 112 and along a sidewall of the bottom plug material 122, the channel material 116 may be present along internal sidewalls of the barrier material 114, over a top surface of the bottom plug material 122, and along external sidewalls of the another barrier material 118, and the barrier material 118 may be present along internal sidewalls of the channel material 116. In other embodiments, the barrier material 114 may extend along internal sidewalls of the gate dielectric material 112 and over the top surface of the bottom plug material 122, the channel material 116 may extend along internal sidewalls of the barrier material 114, over a top surface of barrier material 114, and along external sidewalls of the another barrier material 118, and the barrier material 118 may be present along internal sidewalls of the channel material 116. In such embodiments, an individual conductive gate material 106 and an adjacent portion of the gate dielectric material 112, the barrier material 114, the channel material 116, and the another barrier material 118 may define a vertical memory cell 120a. By way of non-limiting example, the vertical memory cell 120a may comprise a silicon-doped aluminum gallium nitride barrier, a gallium nitride channel, and a silicon-doped aluminum gallium nitride barrier. With reference to FIG. 2B, in some embodiments, the another barrier material 118 is omitted in the vertical channel 110. Accordingly, the channel material 116 may be present along internal sidewalls of the barrier material 114, over a top surface of the bottom plug material 122 or over a top surface of the barrier material 114, which may be formed over the top surface of the bottom plug material 122, and along internal sidewalls of the insulating material 130. In such embodiments, an individual conductive gate material 106 and an adjacent portion of the gate dielectric material 112, the barrier material 114, and the channel material 116 may define a vertical memory cell 120b. By way of non-limiting example, the vertical memory cell 120b may comprise an aluminum gallium oxide barrier and gallium indium oxide channel. With reference to FIG. 2C, in further embodiments, each of the barrier material 114 and the another barrier material 118 is omitted from the vertical channel 110. Accordingly, the channel material 116 may be present along internal sidewalls of the gate dielectric material 112, over a top surface of the bottom plug material 122, and along internal sidewalls of the insulating material 130. In such embodiments, an individual conductive gate material 106 and an adjacent portion of the gate dielectric material 112 and the channel material 116 may define a vertical memory cell 120c. By way of non-limiting example, the vertical memory cell 120c may comprise a zinc oxide channel.

One or more of the barrier material 114, the channel material 116, and the another barrier material 118 may be heterogeneous in composition across respective widths (e.g., in the X-direction) thereof, such that amounts (e.g., atomic concentrations) of one or more elements thereof are non-uniform (e.g., vary, change) as the barrier material 114, the channel material 116, and the another barrier material 118, respectively, extend within the vertical channel 110. The heterogeneity of the barrier material 114, the channel material 116, and the another barrier material 118 may be substantially undetectable by visual inspection, but may be detectable by conventional spectroscopy or spectrometry techniques. In some embodiments, one or more of the barrier material 114, the channel material 116, and the another barrier material 118 may comprise a heterogeneous composition of a single (e.g., only one) semiconductor material comprising two or more elements, but atomic concentrations of one or more (e.g., one, two, three or more) elements of the single semiconductor material (and, hence, the relative atomic ratios of the elements thereof) may be different across the width (e.g., in the X-direction) of the barrier material 114, the channel material 116, and the another barrier material 118. Put differently, one or more of the barrier material 114, the channel material 116, and the another barrier material 118 may comprise a single semiconductor material compositionally graded (e.g., exhibiting a composition gradient) across the width thereof. In other embodiments, one or more of the barrier material 114, the channel material 116, and the another barrier material 118 may comprise a heterogeneous structure (e.g., horizontal stack, horizontal laminate) of two or more (e.g., two, three, more than three) different materials each individually exhibiting a substantially homogeneous distribution of the elements thereof (e.g., a substantially homogeneous composition). In such embodiments, one or more of the barrier material 114, the channel material 116, and the another barrier material 118 comprise a plurality of horizontally neighboring materials, wherein horizontally adjacent (e.g., adjoining, abutting) materials of the plurality have different compositions relative to each other such that horizontally adjacent materials may include at least one element not present in a respective horizontally adjacent material or may be substantially free of at least one element included in a horizontally adjacent material.

Accordingly, as the composition of the barrier material 114, the channel material 116, and/or the another barrier material 118 may vary across respective widths thereof within the vertical channel 110, the band gap of the barrier material 114, the channel material 116, and/or the another barrier material 118 may vary horizontally within the vertical channel 110. By way of non-limiting example, the band gap of the channel material 116 increases across a width of the channel material 116 within the vertical channel 110. Accordingly, the composition and, thus, band gap of the barrier material 114, the channel material 116, and/or the another barrier material 118 may be tailored to selectively vary the electron mobility and transconductance of the channel material 116 and, thus, the electrical performance of the memory device 100 as a whole.

Thus, in some embodiments, an electronic device comprises an array of memory cells comprising a channel material laterally proximate to tiers of alternating conductive materials and dielectric materials. The channel material comprises a heterogeneous semiconductive material varying in composition across a width thereof.

Thus, in other embodiments, an electronic device comprises an array of memory cells comprising a channel material laterally proximate to tiers of alternating conductive materials and dielectric materials. The channel material comprises a semiconductive material having a first band gap. At least one barrier material extends vertically along at least one sidewall of the channel material, the at least one barrier material comprising a heterogeneous semiconductive material varying in composition across a width thereof. The heterogeneous semiconductive material has a second band gap different from the first band gap.

As described in further detail below, one or more of the barrier material 114, the channel material 116, and the another barrier material 118 may be formed through various processes. The process (or processes) employed to form the barrier material 114, the channel material 116, and/or the another barrier material 118 may at least partially depend on the desired properties (e.g., material compositions, compositional gradients, compositional structures, material distributions, dimensions) of the barrier material 114, the channel material 116, and/or the another barrier material 118. Suitable processes include, but are not limited to, chemical vapor deposition (CVD), plasma-enhanced chemical vapor deposition (PECVD), atomic layer deposition (ALD), plasma-enhanced atomic layer deposition (PEALD) and physical vapor deposition (PVD) (including sputtering, evaporation, and/or ionized PVD), so long as the process employed permits the adjustment of one or more parameters (e.g., materials, material flow rates) facilitating the formation of the compositional gradient or heterogeneous structure of the channel material 116, as previously described herein. In some embodiments, the barrier material 114, the channel material 116, and/or the another barrier material 118 is formed by ALD, enabling the barrier material 114, the channel material 116, and/or the another barrier material 118 to be formed in openings having a high aspect ratio (HAR), such as a HAR of at least about 20:1, at least about 50:1, at least about 100:1, or at least about 1000:1. Forming the barrier material 114, the channel material 116, and/or the another barrier material 118 by ALD may also enable the barrier material 114, the channel material 116, and/or the another barrier material 118 to be formed within the vertical channel 110 to have a substantially uniform thickness (e.g., width) and to have substantially uniform coverage of sidewalls of the tiers 105 of the alternating conductive gate material 106 and vertically adjacent second dielectric materials 108. Having more uniform coverage over a high aspect ratio vertical channel 110 enables the production of memory devices 100 having a greater density of memory cells 120 (shown individually as vertical memory cells 120a, 120b, 120c in FIGS. 2A and 2B) while decreasing the horizontal dimensions of the vertical channel 110.

FIGS. 3-14 illustrate a method of forming a memory device including vertical strings of memory cells, at various stages of the method, according to embodiments of this disclosure. For simplicity, the formation of a single vertical string of memory cells is illustrated, but will be understood by one of ordinary skill in the art that the method may include simultaneously forming multiple (e.g., an array of) vertical strings of memory cells. Throughout the remaining description and the accompanying figures, functionally similar features (e.g., structures, devices) are referred to with similar reference numerals incremented by 100. To avoid repetition, not all features shown in the remaining figures are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature.

Figure 3:
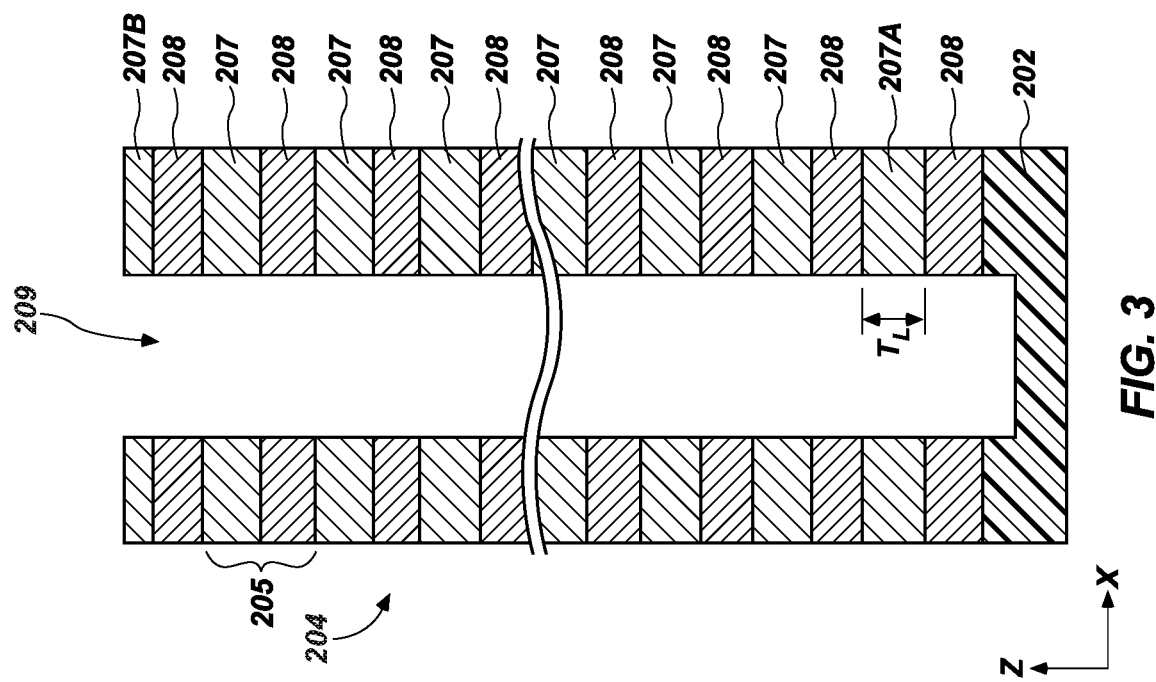

Referring to FIG. 3, a stack 204 of alternating first dielectric materials 207 and second dielectric materials 208 may be formed over a substrate 202, and vertical openings 209 may be formed through the stack 204 to expose the substrate 202. The substrate 202 may be, or include, a semiconductor material, such as silicon (e.g., polysilicon) or silicon germanium, for example.

The first dielectric materials 207 and second dielectric materials 208 may be formed over the substrate 202 in alternating fashion. The stack 204 may be formed with any number of respective first dielectric materials 207 and second dielectric materials 208, such as about 32, about 64, about 96, or about 128, for example. The formation of the first and second dielectric materials 207, 208 may be accomplished by, for example, CVD, PECVD, ALD, a spin-on process, etc. The first and second dielectric materials 207, 208 may be different from, and may exhibit etch selectivity with respect to, each other. For example, the first dielectric materials 207 may be or include silicon nitride and the second dielectric materials 208 may be or include silicon oxide. A lowermost first dielectric material 207A may be formed to have a greater vertical thickness $T_L$ (e.g., about 45 nm) than each the remaining first dielectric materials 207 in the stack 204 (which may have a vertical thickness of, e.g., about 35 nm). An uppermost first dielectric material 207B may serve as a sacrificial protective barrier for the stack 204 during subsequent processing steps.

As described below (FIG. 13), the first dielectric materials 207 or portions thereof may later be removed and replaced by conductive gate materials 206 by a so-called "replacement gate" process to form tiers 205 of alternating conductive gate material 206 and vertically adjacent second dielectric materials 208. However, in other embodiments, the stack 204 may be initially formed to include the alternating conductive gate materials 206 in place of the first dielectric materials 207 in a so-called "floating gate" process.

After the stack 204 is formed over the substrate 202, portions of the stack 204 may be removed to form vertical openings 209 through the stack 204 to expose the substrate 202 at a base of the vertical openings 209. The portions of the stack 204 may be removed by an anisotropic photolithographic process, including formation of a mask material (not shown) over the stack 204, photolithographically patterning and developing the mask material to remove material and form holes over the intended locations of the vertical openings 209, and removing (e.g., etching) the portions of the first and second dielectric materials 207, 208 directly beneath the holes in the mask.

Figure 4:
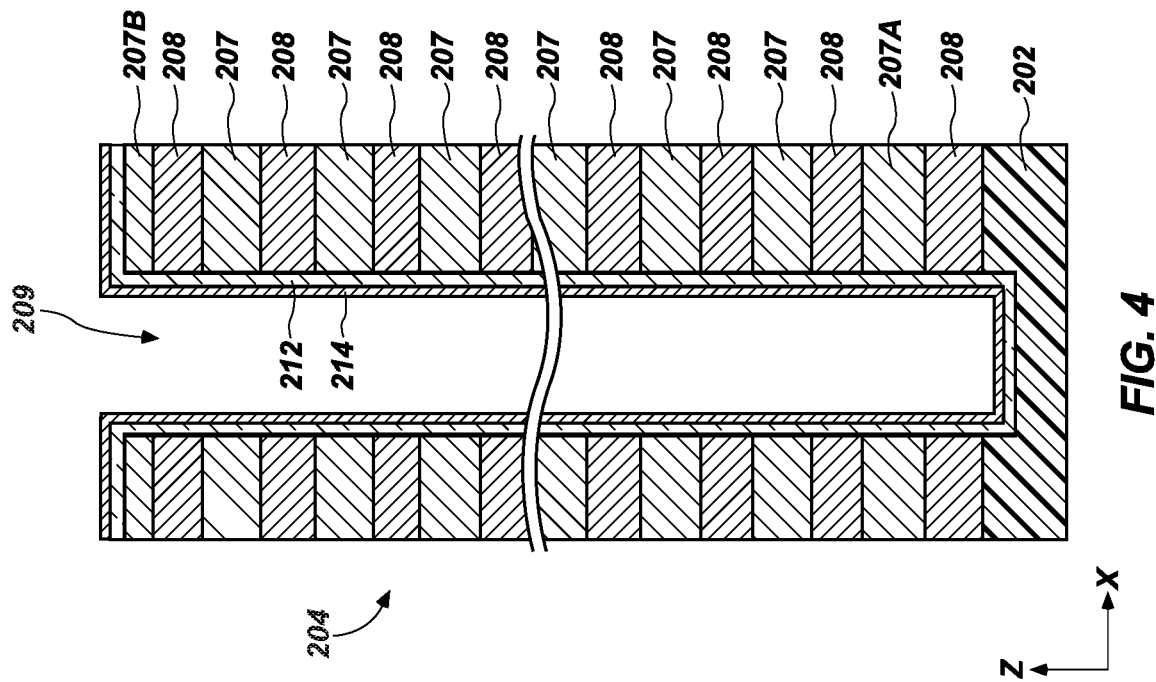

Referring to FIG. 4, a gate dielectric material 212 may be formed within and along internal sidewalls of the vertical openings 209, as well as over a top surface of the stack 204 and over the exposed portion of the substrate 202 at the base of the vertical openings 209. A barrier material 214 may optionally be formed within and along internal sidewalls of the gate dielectric material 212, as well as over a top surface of the gate dielectric material 212 and over the portion of the gate dielectric material 212 at the base of the vertical openings 209. The gate dielectric material 212 and the barrier material 214 may each be formed by a conformal deposition process, such as ALD. In such embodiments, the barrier material 214 is formed, at least in part, through an ALD process that includes adjusting (e.g., modifying, varying, changing) flow rates of one or more ALD precursors and/or one or more ALD reactants, and/or modifying one or more deposition cycle parameters (e.g., precursors, reactants, pulse times) during deposition of the barrier material 214 as it extends away (e.g., horizontally or vertically) from the stack 204.

For example, the stack 204 may be provided into a deposition chamber (e.g., an ALD chamber) configured to receive alternating pulses of at least one precursor and at least one reactant with intervening pulses of at least one inert gas (e.g., nitrogen, argon, helium, neon, krypton, xenon, and/or other gases that, although not inert, behave as inert under the conditions of the channel formation process). The precursor may comprise a complex of at least one metal species and/or at least one metalloid species for inclusion in the barrier material 214 and at least one ligand (e.g., a ligand comprising one or more of hydrogen, nitrogen, oxygen, and carbon) formulated to react with (and be eliminated by) the reactant. The reactant may comprise a material reactive with the ligand of the precursor to form the at least a portion of the barrier material 214, such as at least one oxidizing agent (e.g., oxygen, ozone, water, hydrogen peroxide, nitrous oxide) or at least one nitriding agent (e.g., nitrogen, ammonia). The precursor may further comprise a dopant. The barrier material 214 may be formed by adjusting one or more of the precursor species, precursor species amounts, precursor pulse times, number of pulses of each precursor, reactant species, reactant species amounts, reactant pulse times, inert species, inert species pulse times, dopant species, dopant species amounts, and dopant pulse times during the deposition process. Further, in some embodiments, one or more of the precursor species, the reactant species, and the dopant species may be selected to comprise a species having a larger molecular size than a previously or subsequently deposited species to selectively control the steric hindrance and, accordingly, the composition or dopant of the deposited material. By way of non-limiting example, selecting a species having a relatively larger molecular size with increased steric hindrance may provide a mechanism for varying or controlling the composition of the deposited materials such as a dopant concentration in the barrier material 214.

As previously described herein, the barrier material 214 may be heterogeneous in composition across a width thereof. Accordingly, the barrier material 214 may be formed by adjusting one or more of the precursor species, precursor species amounts, precursor pulse times, number of pulses of each precursor, reactant species, reactant species amounts, reactant pulse times, inert species, inert species pulse times, dopant species, dopant species amounts, and dopant pulse times during the deposition process to vary the composition of the barrier material 214 across a width thereof. In some embodiments, the ALD process includes forming the barrier material 214 to include a heterogeneous structure comprising two or more different materials that may each individually have a substantially homogeneous composition. In such embodiments, the ALD process includes forming (e.g., depositing, conformally depositing) multiple homogeneous semiconductive materials to produce the heterogeneous structure of the barrier material 214. In other embodiments, the ALD process includes forming the barrier material 214 to comprise single semiconductive material comprising different atomic concentrations of elements thereof. In such embodiments, the ALD process includes adjusting atomic concentrations of one or more elements of the single semiconductive material as the barrier material 214 is formed.

By way of non-limiting example, the barrier material 214 may be selected to comprise a silicon-doped aluminum gallium nitride (AlGaN:Si). In some embodiments, respective aluminum, nitrogen, gallium, and silicon precursors are consecutively and/or discretely pulsed (e.g., individually deposited) over the stack 204. Each discretely pulsed precursor may be deposited up to a monolayer in thickness (e.g., width) prior to pulsing of the next pulsed precursor. In other embodiments, one or more of the respective aluminum, nitrogen, gallium, and silicon precursors are co-deposited (e.g., simultaneously pulsed, simultaneously deposited).

By way of example and not limitation, the barrier material 214 may be undoped, or may include a p-type dopant or an n-type dopant. In some embodiments, the barrier material 214 is delta-doped.

Figure 5:
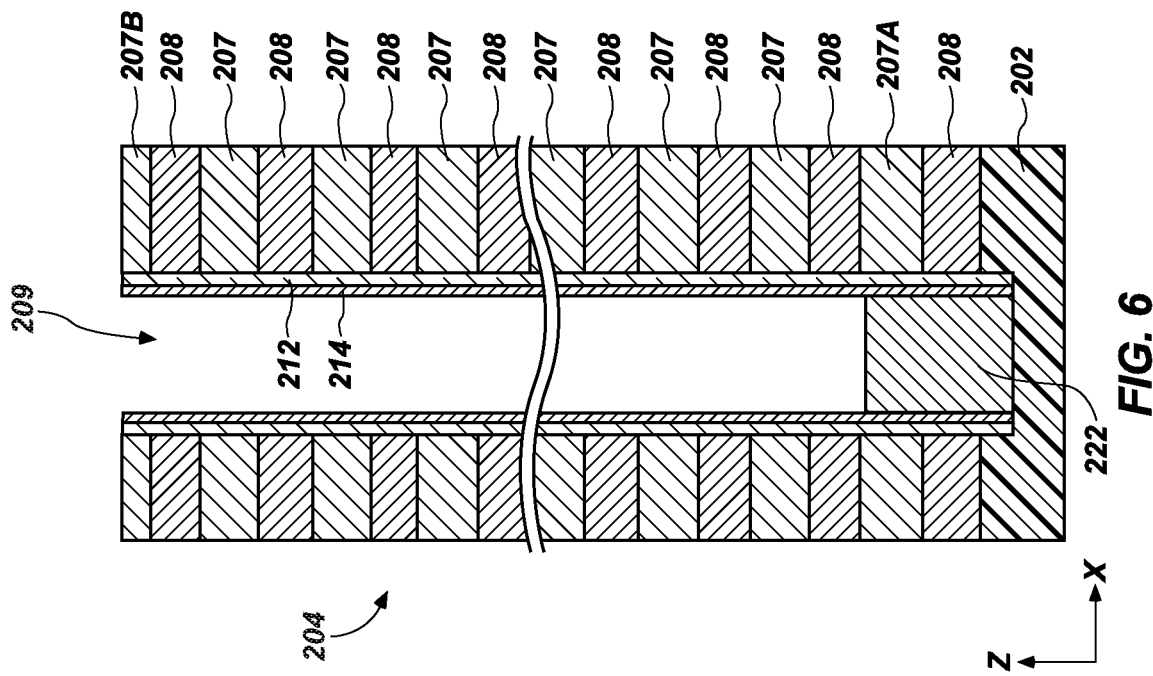

Referring to FIG. 5, a portion of the gate dielectric material 212 and the barrier material 214 formed over horizontal surfaces, such as over the top surface of the stack 204 and over the exposed surface of the substrate 202 at the base of the vertical openings 209, may be subjected to at least one material removal process (e.g., an etching process). Portions of the gate dielectric material 212 and the barrier material 214 that are formed over vertical surfaces, such as over the internal sidewalls of the vertical openings 209, may remain after the removal process, as shown in FIG. 5.

Figure 6:
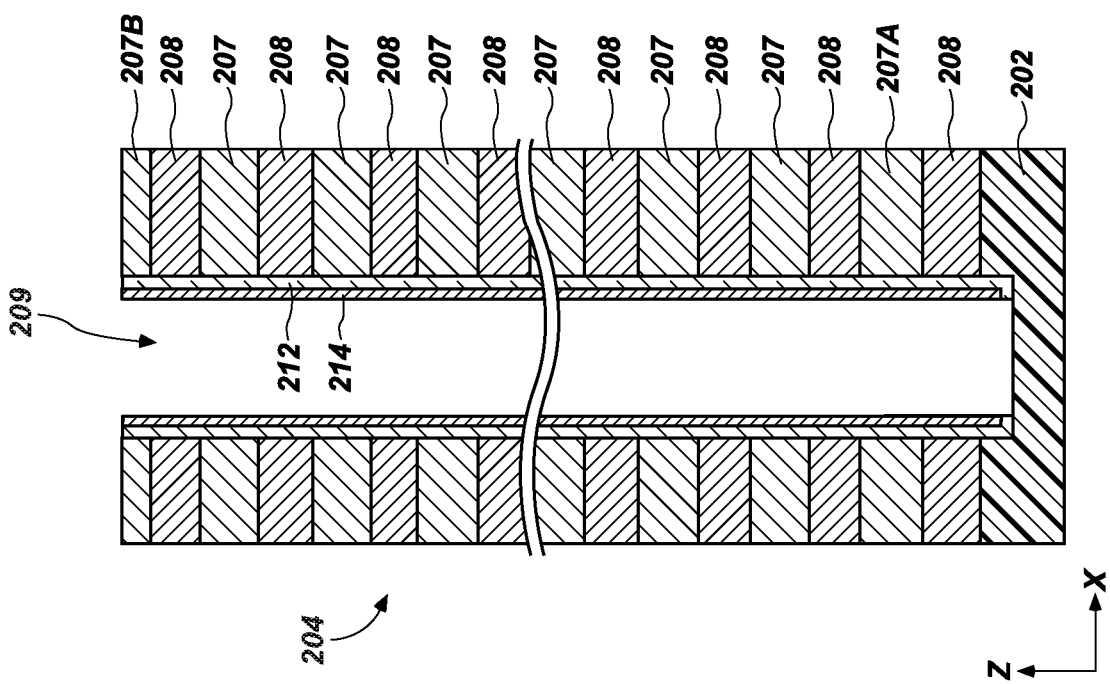

Referring to FIG. 6, a bottom plug material 222 may be formed within and at a base of the vertical openings 209. The bottom plug material 222 may be a semiconductor material exhibiting a band gap at room temperature of less than about 1.10 eV. By way of example, the bottom plug material 222 may be or include silicon germanium, germanium, or indium gallium arsenide. The bottom plug material 222 may include an n-type dopant. Forming the bottom plug material 222 from a material that exhibits a band gap of less than about 1.10 eV may increase a GIDL current in string erase operations of a resulting device, compared to bottom plug materials exhibiting a higher band gap. In other embodiments, the bottom plug material 222 may comprise a semiconductor material substantially similar to the semiconductor material of the channel material 116 as previously described herein with reference to FIG. 1. By forming the bottom plug material 222 to comprise a material similar in composition to the channel material 216, the ohmic contact between the bottom plug material 222 and the channel material 216 may be improved.

In some embodiments, the bottom plug material 222 may be epitaxially grown, using the substrate 202 (e.g., silicon) as a seed material. The bottom plug material 222 may be formed to at least partially overlap the lowermost first dielectric material 207A. By way of example and not limitation, an upper extent of the bottom plug material 222 may be about one-half to about two-thirds up the vertical thickness of the lowermost first dielectric material 207A. Previously forming the lowermost first dielectric material 207A to have a greater thickness $T_L$ (FIG. 3) than the remaining first dielectric materials 207 allows for a wider margin of error when forming the bottom plug material 222 to have an upper extent in an intended location relative to the lowermost first dielectric material 207A.

Figure 7:
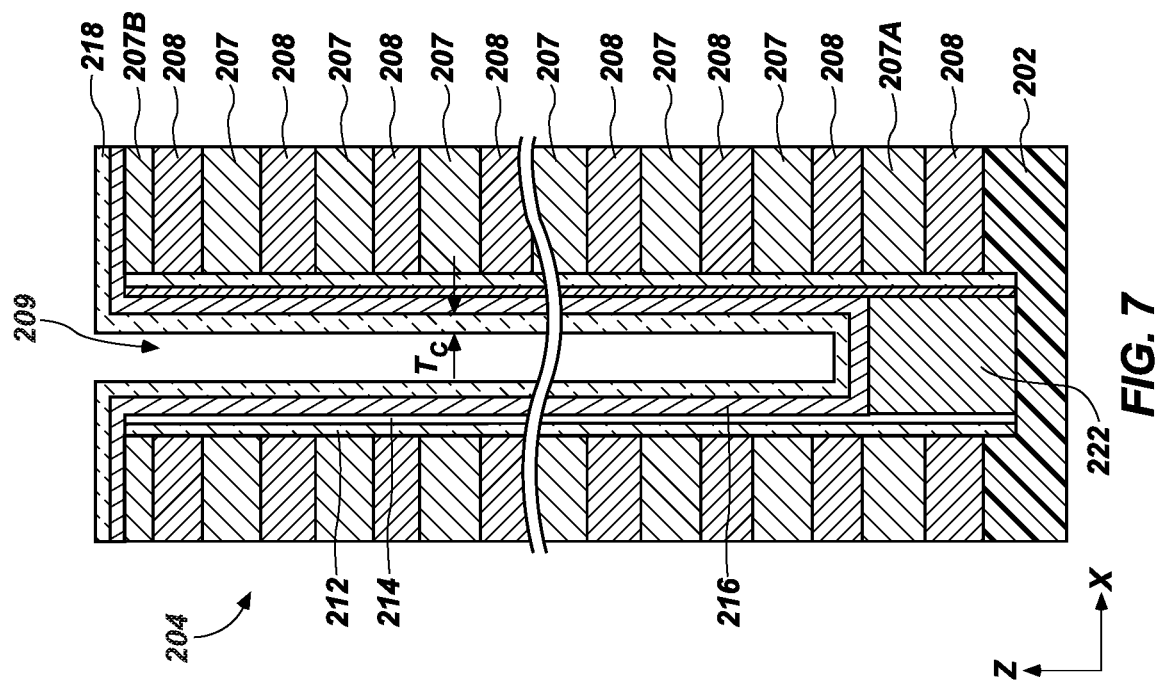

Referring to FIG. 7, a channel material 216 may be formed within the vertical openings 209. In some embodiments (as shown in FIG. 7), the channel material 216 may be formed (e.g., conformally formed) along the inner sidewalls of the vertical openings 209, over the bottom plug material 222, and over inner sidewalls of the barrier material 214. In such embodiments, as described with reference to the barrier material 214, the channel material 216 is formed, at least in part, through an ALD process that includes adjusting (e.g., modifying, varying, changing) flow rates of one or more precursors and/or one or more reactants, and/or modifying one or more deposition cycle parameters (e.g., precursors, reactants, pulse times) during deposition of the channel material 216 as it extends away (e.g., horizontally or vertically) from the stack 204. For example, the stack 204 may be maintained within the deposition chamber (e.g., an ALD chamber) in which the barrier material 214 is deposited and may be configured to receive alternating pulses of at least one precursor and at least one reactant with intervening pulses of at least one inert gas (e.g., nitrogen argon, helium, neon, krypton, xenon, and/or other gases that, although not inert, behave as inert under the conditions of the channel formation process). The precursor may comprise a complex of at least one metal species and/or at least one metalloid species for inclusion in the channel material 216 and at least one ligand (e.g., a ligand comprising one or more of hydrogen, nitrogen, oxygen, and carbon) formulated to react with (and be eliminated by) the reactant. The reactant may comprise a material reactive with the ligand of the precursor to form the at least a portion of the channel material 216, such as at least one oxidizing agent (e.g., oxygen, ozone, water, hydrogen peroxide, nitrous oxide) or at least one nitriding agent (e.g., nitrogen). The precursor may further comprise a dopant. In some embodiments, the channel material 216 is configured as a liner. In other embodiments, the channel material 216 may be formed to substantially fill the vertical openings 209, such as to reduce manufacturing costs.

As previously described herein, the channel material 216 may be heterogeneous in composition across a width thereof. Accordingly, the channel material 216 may be formed by adjusting one or more of the precursor species, precursor species amounts, precursor pulse times, number of pulses of each precursor, reactant species, reactant species amounts, reactant pulse times, inert species, inert species pulse times, dopant species, dopant species amounts, and dopant pulse times during the deposition process to vary the composition of the channel material 216 across a width thereof. In some embodiments, the ALD process includes forming the channel material 216 to include a heterogeneous structure comprising two or more different materials that may each individually have a substantially homogeneous composition. In such embodiments, the ALD process includes forming (e.g., depositing, conformally depositing) multiple homogeneous semiconductive materials to produce the heterogeneous structure of the channel material 216. In other embodiments, the ALD process includes forming the channel material 216 to comprise single semiconductive material comprising different atomic concentrations of elements thereof. In such embodiments, the ALD process includes adjusting atomic concentrations of one or more elements of the single semiconductive material as the channel material 216 is formed. Further, in some embodiments, one or more of the precursor species, the reactant species, and the dopant species may be selected to comprise a species having a larger molecular size than a previously or subsequently deposited species to selectively control the steric hindrance and, accordingly, the composition or dopant of the deposited channel material 216. The channel material 216 may be undoped, or may include a p-type dopant or an n-type dopant.

With continued reference to FIG. 7, another barrier material 218 may optionally be formed (e.g., conformally formed) over the channel material 216. The another barrier material 218 may be formed by an ALD process as previously described with reference to the barrier material 214 including forming the another barrier material 218 to be heterogeneous in composition across a width thereof. For example, in some embodiments, the another barrier material 218 may substantially fill the vertical openings 209 adjacent to the channel material 216. In such embodiments, the composition of the barrier material 218 may be heterogeneous in composition across a width thereof such that a portion of the barrier material 218 is insulative (e.g., substantially non-conductive).

With continued reference to FIGS. 5 through 7, a composition of two or more of the barrier material 214, the channel material 216, and the another barrier material 218 may be selected to comprise similar materials, or materials having at least one element common therebetween. In some embodiments, adjacent (e.g., horizontally adjacent) materials, such as the barrier material 214 and the channel material 216 or the another barrier material 218 and the channel material 216, may comprise materials having at least one elements common therebetween. By way of non-limiting example, two or more of the barrier material 214, the channel material 216, and the another barrier material 218 may comprise an oxide-based material, a nitride-based material, or an indium-based material. By selecting adjacent materials within the vertical channel 210 to comprise similar materials, processing conditions, such as deposition temperatures, and processing tools may be maintained during at least a portion of the ALD process as the barrier material 214, the channel material 216, and the another barrier material 218 are formed. Further, interfaces between similar materials are less susceptible to inter-diffusion or rearrangement into more thermodynamically favorable configurations during subsequent processing steps in which the vertical channel 210 and the materials thereof may be subjected to relatively higher temperatures.

Figure 8:
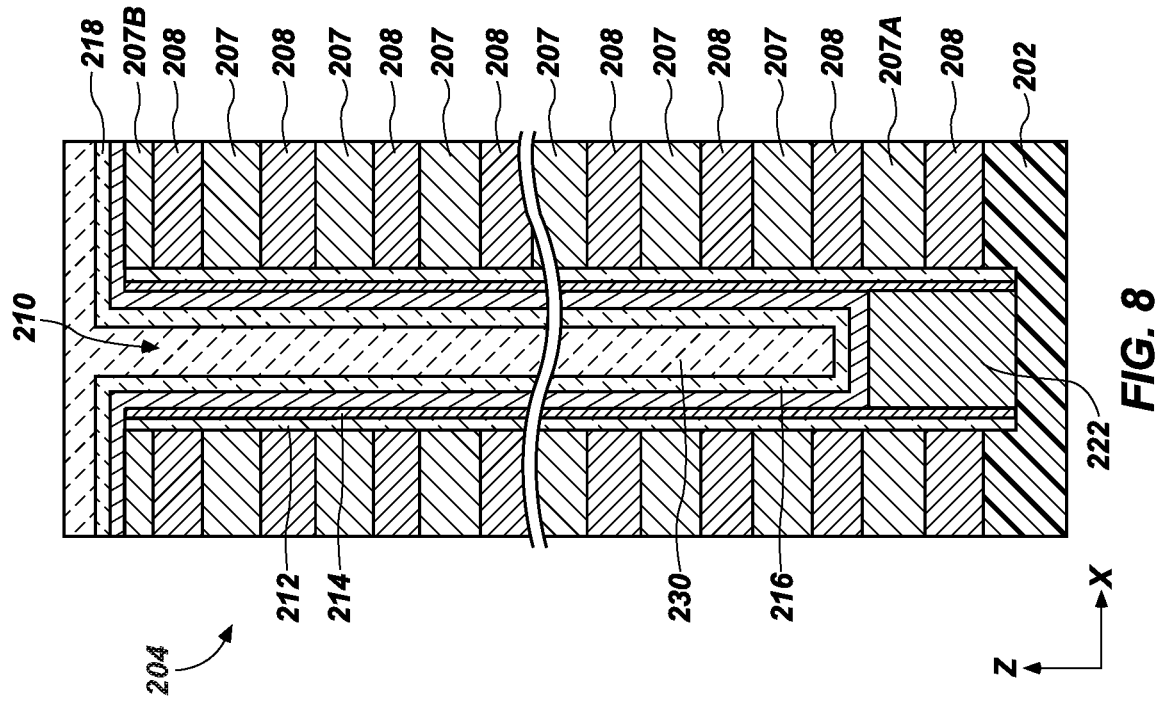

Referring to FIG. 8, in embodiments in which the channel material 216 is formed as a conformal film (i.e., not substantially filling the vertical opening 209), a central insulating material 230 may be formed to substantially fill the vertical opening 209 adjacent to the channel material 216 and/or the another barrier material 218 and forming the vertical channel 210 including the gate dielectric material 212, the barrier material 214, the channel material 216, the another barrier material 218, and/or the insulating material 230. In some embodiments, an air-filled void may be left within the vertical channel 210 adjacent to the channel material 216 and/or the another barrier material 218. In some embodiments, the central insulating material 230 may be formed of a so-called "spin-on dielectric" or "SOD" material by depositing a flowable dielectric over the stack 204 and spinning the substrate 202 to spread the flowable dielectric across upper surfaces of the stack 204 and into the vertical opening 209. The flowable dielectric may then be densified, such as by heat or chemical treating.

Figure 9:
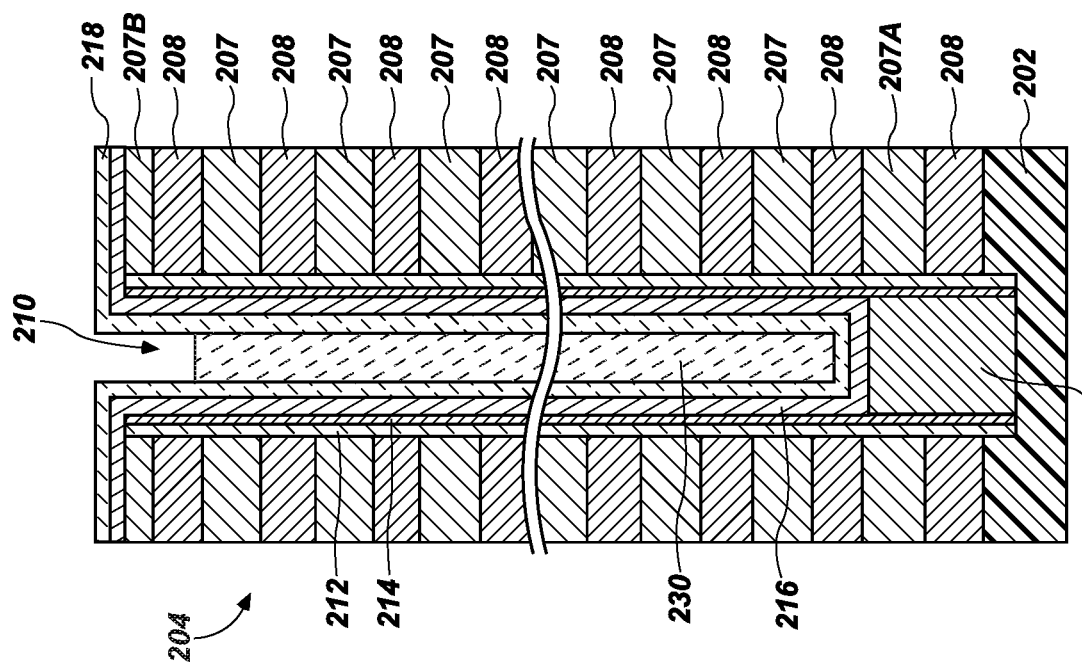

Referring to FIG. 9, portions of the insulating material 230 over a top surface of the stack 204 may be removed, such as by an abrasive planarization (e.g., a chemical-mechanical planarization (CMP)) process. A portion of the remaining insulating material 230 proximate a top of the vertical channel 210 may be selectively removed, to recess a top surface of the insulating material 230 below the top surface of the stack 204. The insulating material 230 may be recessed by an etch process, such as by exposing the central dielectric to an etchant configured to remove the material of the insulating material 230 but that does not remove the material of the channel material 216, the material of the barrier materials 214, 218, or the gate dielectric material 212. The insulating material 230 may be recessed to a vertical level such that a space above the insulating material 230 at least partially overlaps with what will become an uppermost select gate drain (e.g., an upper first dielectric material 207 that will be replaced by a conductive gate material 206 (FIG. 13) configured for functioning as an uppermost select gate drain).

Figure 10:
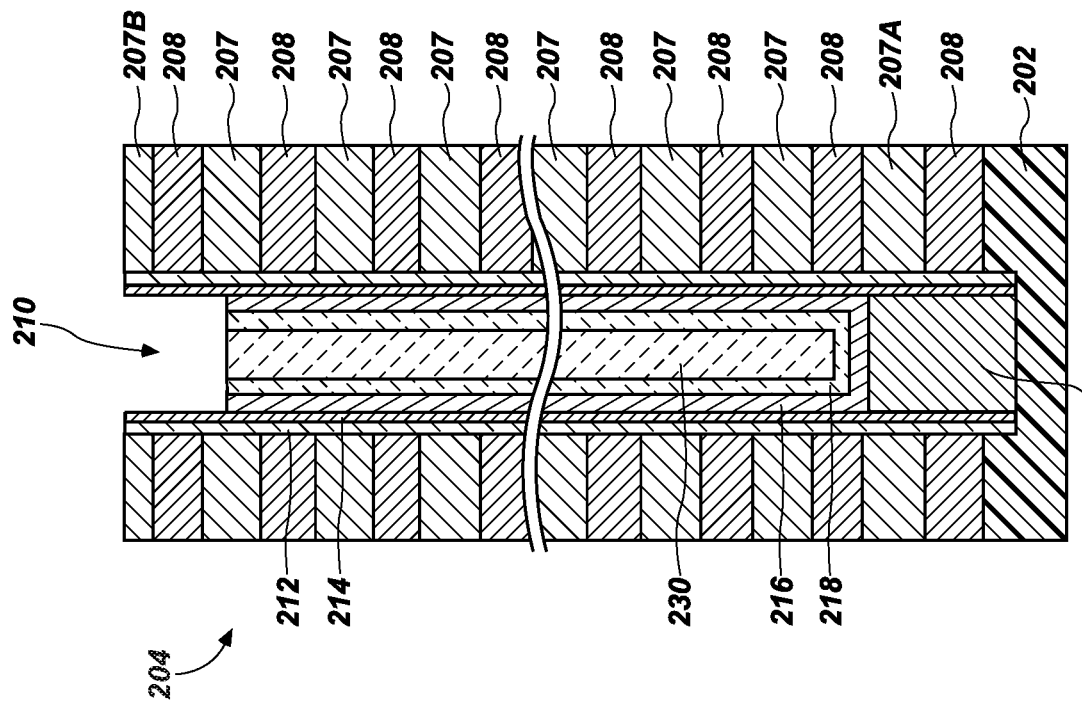

Referring to FIG. 10, portions of the barrier material 218 and the channel material 216 over a top surface of the stack 204 and within the vertical channel 210 above the recessed insulating material 230 may be selectively removed, such as using an etch configured to remove the barrier material 218 and the channel material 216 but not remove the first or second dielectric materials 207, 208, the gate dielectric material 112, and the barrier material 114. By way of non-limiting example, the portions of the channel material 216 may be removed by exposure to a solution of hydrofluoric acid and water, hydrochloric acid and water, or phosphoric acid and water.

Figure 11:
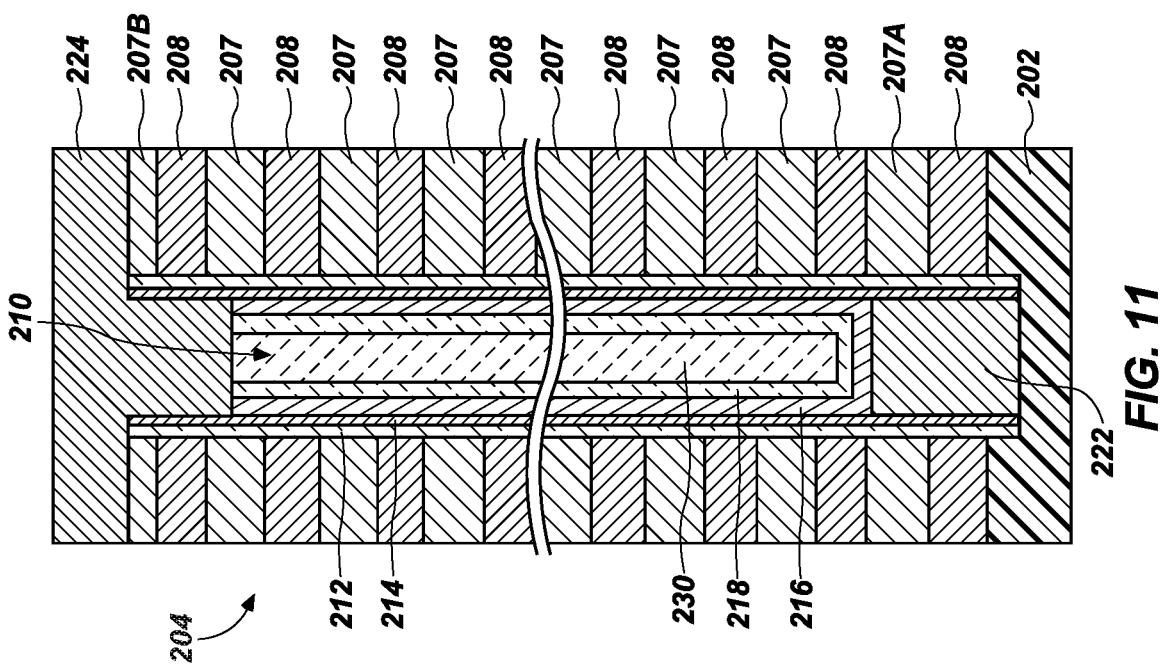

Referring to FIG. 11, a top plug material 224 may be formed within the vertical channel 210 and electrically coupled to the channel material 216. The top plug material 224 may be a semiconductor material, such as polysilicon, silicon germanium, or germanium, for example. The top plug material 224 may include an n-type dopant. The process for forming the top plug material 224 may be, for example, CVD. The top plug material 224 may initially be formed over a top surface of the stack 204, in addition to within the vertical channel 210.

Figure 12:
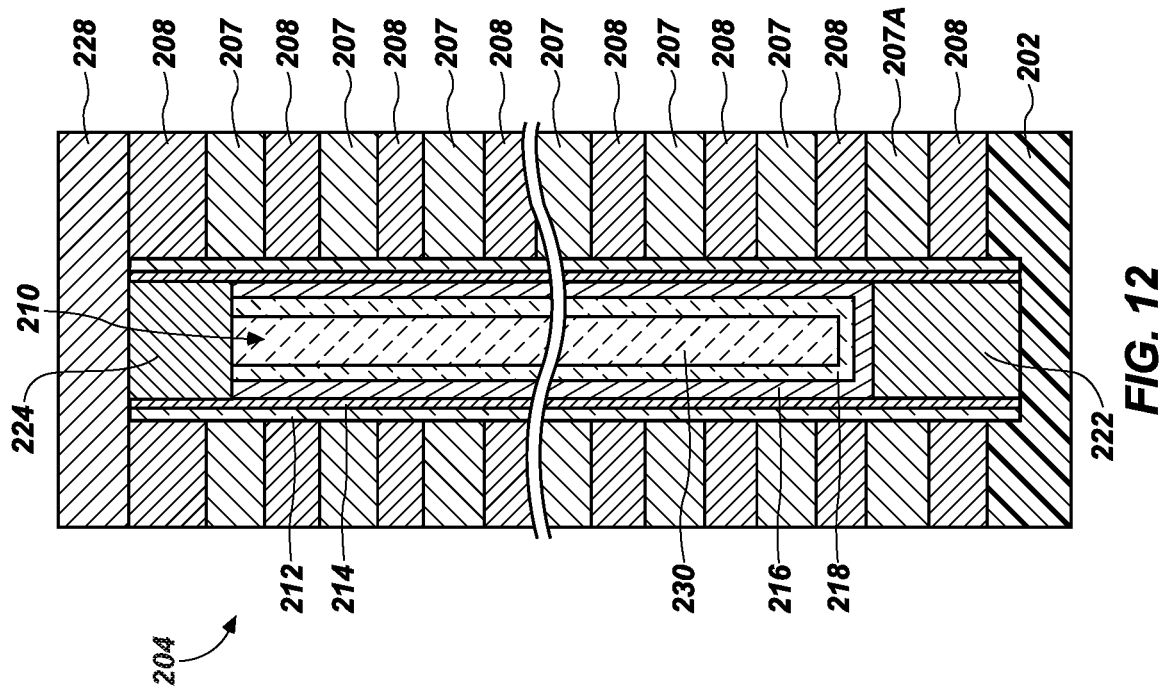

Referring to FIG. 12, portions of the top plug material 224 over a top surface of the stack 204 may be removed, such as by CMP or etching. In addition, the uppermost first dielectric material 207B, which previously served as a sacrificial barrier layer during prior processing acts, may be removed, such as by CMP or etching. A cap dielectric material 228 may be formed over the stack 204. The cap dielectric material 228 may include one or more dielectric materials, such as silicon oxide and/or silicon nitride.

Referring to FIG. 13, the first dielectric materials 207 may be removed and replaced by conductive gate materials 206. To remove the first dielectric materials 207, one or more slots or holes (not shown) may be formed through the stack 204 to expose each of the first dielectric materials 207 in the stack 204. An isotropic material removal process may be performed to selectively remove the first dielectric materials 207, without removing the second dielectric material 208. For example, an etchant may be introduced into the one or more slots or holes and in contact with the first dielectric materials 207 to remove the first dielectric materials 207 and to form gaps between the second dielectric materials 208. After the first dielectric materials 207 are removed, the conductive gate materials 206 may be formed by introducing a conductive material (e.g., one or more of titanium, titanium nitride, tantalum, tantalum nitride, tungsten, or tungsten nitride) into the one or more slots or holes and into the gaps left by removal of the first dielectric materials 207, such as by a deposition process (e.g., CVD or ALD). Any residual conductive material within the slots may be removed, and the slots may be filled with a dielectric material.

The process of forming the vertical channels 210 described above, including forming the barrier material 214, the channel material 216, and/or the another barrier material 218 prior to replacing the first dielectric materials 207 with the conductive gate materials 206 introduced through slots or holes, is known in the art as a so-called "replacement gate" process. However, this disclosure is not limited to forming the conductive gate materials 206 using such a replacement gate process. Rather, this disclosure is also applicable to a so-called "floating gate" process, in which portions of first dielectric materials 207 are instead initially formed of the conductive gate materials 206 and are formed prior to forming the barrier material 214, the channel material 216, and/or the another barrier material 218.

Referring to FIG. 14, when the conductive gate materials 206 are formed, an individual conductive gate material 206 and an adjacent portion of the gate dielectric material 212, the barrier material 214, the channel material 216, and the another barrier material 218 may define an individual memory cell 220. The group of memory cells 220 located along a particular vertical channel 210 may define a vertical string of memory cells 220.

Still referring to FIG. 14, a data line 226 (e.g., bit line) may be formed over and electrically coupled to the top plug material 224 for providing electrical access to the vertical string of memory cells 220. To form the data line 226, portions of the cap dielectric material 228 may be removed (e.g., via photolithography) to define trenches (not shown) within the cap dielectric material 228, exposing the top plug material 224. A conductive material, such as tungsten, tungsten nitride, titanium, titanium nitride, and tantalum, may be deposited into the trenches, such as using CVD, to form data lines 226. Any residual conductive material over a top surface of the cap dielectric material 228 may be removed, such as by CMP. The data lines 226 may extend horizontally into and out of the page from the perspective shown in FIG. 14.

In some embodiments, after or during a process in which the memory device 200 is formed, at least a portion of the memory device 200 may be subject to an annealing process. By way of example and not limitation, at least a portion of the memory device 200 may be to a rapid thermal annealing process. By annealing the memory device, the crystallinity of one or more materials thereof (e.g., the gate dielectric material 212, the barrier material 214, the channel material 216, the another barrier material 218) may be selectively modified to etch resistance of the materials, to improve an ohmic contact between one or more of the materials (e.g., the channel material 216 and the bottom plug material 222), to reduce off-state leakage of the transistor, and/or to selectively vary the transconductance of the materials and, thus, the electrical performance of the memory device 100 as a whole.

Accordingly, in some embodiments, methods of forming an electronic device include forming vertical openings extending through a stack of alternating conductive gate materials and dielectric materials over a material. A channel material is formed within the vertical openings, the channel material comprising a heterogeneous semiconductive material varying in composition across a width thereof.

Accordingly, in other embodiments, methods of forming an electronic device include forming vertical openings extending through a stack of alternating conductive materials and dielectric materials over a material. A channel material is formed within the vertical openings. At least one barrier material is formed within the vertical openings and adjacent to at least one vertical sidewall of the channel material. The at least one barrier material comprises a heterogeneous semiconductive material varying in composition across a width thereof.

While the memory device 100 and the method of forming the memory device 200 has been described with reference to formation of a NAND Flash memory device, one of ordinary skill in the art will appreciate that the features and feature configurations described above in relation to FIGS. 2A through 2C may be readily adapted to the design needs of different semiconductor devices (e.g., different memory devices). For example, the heterogeneous channel material 116, 216 may be incorporated into other vertical memory devices including, but not limited to, random-access memory (RAM), read-only memory (ROM), dynamic random access memory (DRAM), synchronous dynamic random access memory (SDRAM), other Flash memory, and resistance variable memory.

Figure 15:
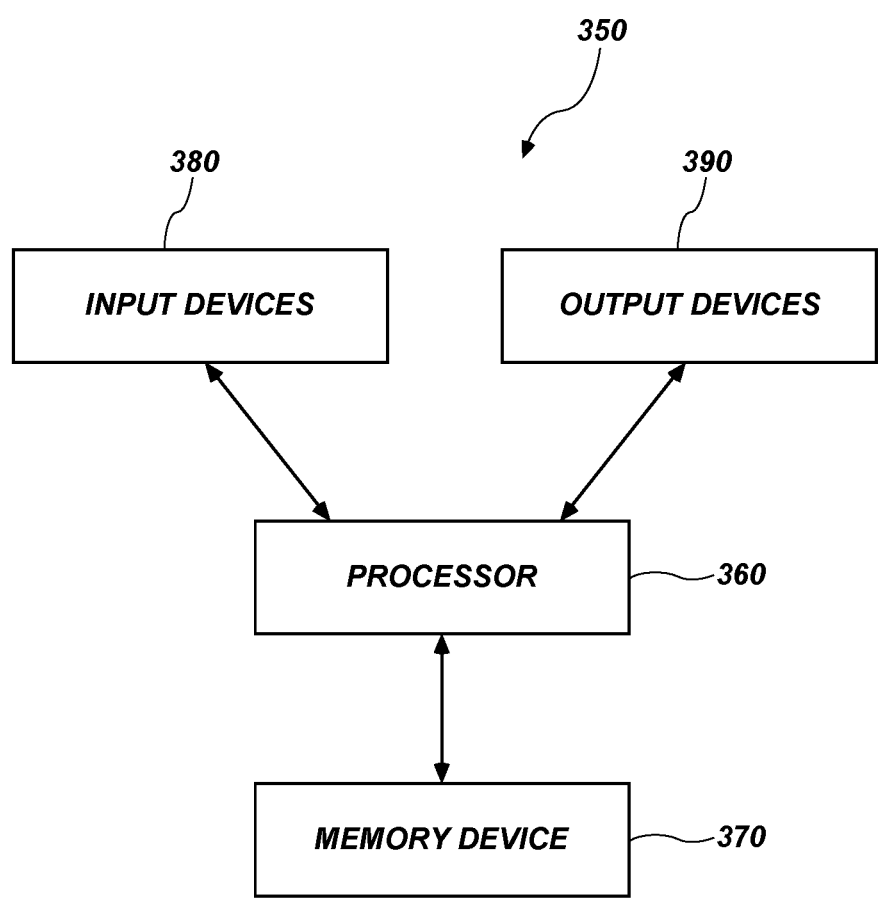
FIG. 15 shows a schematic block diagram of an electronic system according to embodiments of the disclosure.

FIG. 15 is a schematic block diagram of an electronic system 350 according to embodiments of the disclosure. For example, FIG. 15 is a block diagram of an illustrative electronic system 350 according to embodiments of disclosure. The electronic system 350 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 350 includes at least one memory device 370. The at least one memory device 370 may include, for example, embodiments including semiconductor device structures (e.g., the devices 100, 200 previously described herein). The electronic system 350 may further include at least one electronic signal processor device 360 (often referred to as a "microprocessor" or "processor"). The electronic system 350 may further include one or more input devices 380 for inputting information into the electronic system 350 by a user, such as, for example, a mouse or other pointing device, a keyboard, a touchpad, a button, or a control panel. The electronic system 350 may further include one or more output devices 390 for outputting information (e.g., visual or audio output) to a user such as, for example, a monitor, a display, a printer, an audio output jack, a speaker, etc. In some embodiments, the input device 380 and the output device 390 may comprise a single touchscreen device that can be used both to input information to the electronic system 350 and to output visual information to a user. The one or more input devices 380 and output devices 390 may communicate electrically with at least one of the memory device 370 and the electronic signal processor device 360.

Accordingly, in some embodiments, an electronic system comprises a processor operably coupled to an input device and an output device. An electronic device is operably coupled to the processor and comprises an array of vertical memory cells positioned along respective vertical channels to define vertical memory strings. Each vertical channel comprises a semiconductive channel material varying in composition across a width thereof within the vertical channel.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. An electronic device, comprising:
    an array of memory cells comprising:
    tiers of alternating conductive materials and dielectric materials;
    another dielectric material in contact with the tiers of alternating conductive materials and dielectric materials;
    a first barrier material on and in contact with opposing sidewalls of the another dielectric material, the first barrier material comprising delta-doped aluminum gallium nitride or delta-doped aluminum gallium oxide;
    a channel material laterally proximate to the tiers and comprising a heterogeneous semiconductive material varying in composition across a width thereof; and
    a plug material below the channel material, the plug material interposed between portions of the first barrier material on the opposing sidewalls of the another dielectric material.

2. The electronic device of claim 1, wherein the heterogeneous semiconductive material comprises a heterogeneous structure comprising two or more different materials that each individually exhibit a substantially homogeneous composition.

3. The electronic device of claim 1, wherein the heterogeneous semiconductive material comprises a single semiconductive material comprising two or more elements, wherein atomic concentrations of the two or more elements of the single semiconductive material vary across the width of the heterogeneous semiconductive material.

4. The electronic device of claim 1, wherein the heterogeneous semiconductive material comprises one or more of a nitride-containing material, an oxide-containing material, a semiconductive sulfide material, a semiconductive selenide material, a semiconductive phosphide material, a semiconductive arsenide material, a semiconductive telluride material, and a semiconductive antimonide material.

5. The electronic device of claim 1, wherein the heterogeneous semiconductive material comprises one or more of boron nitride, aluminum nitride, gallium nitride, indium nitride, gallium arsenide nitride, aluminum gallium nitride, indium gallium nitride, aluminum gallium arsenide nitride, indium gallium arsenide nitride, indium aluminum arsenide nitride, zinc oxide, indium oxide, tin oxide, cadmium oxide, gallium oxide, copper oxide, nickel oxide, titanium dioxide, hafnium, oxide, zirconium oxide, magnesium oxide, indium tin oxide, and indium antimonide.

6. The electronic device of claim 1, wherein the heterogeneous semiconductive material comprises one or more of one or more of $Zn_xSn_yO$, $In_xZn_yO$, $In_xSn_yO_z$, $Zn_xO$, $In_x\text{-}Ga_yZn_zO$, $In_xGa_ySi_zO_a$, $In_xO$, $Sn_xO$, $Ti_xO$, $Zn_xON_z$, $Mg_xZn_yO$, $In_xZn_yO$, $In_xGa_yZn_zO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Zn_xSn_yO$, $Al_xZn_yS_nzO$, $Ga_xZn_ySn_zO$, $Zr_xZn_ySn_zO$, $In_xGa_ySi_zO$, $In_xAl_yGa_zO_a$, and $In_xAl_yGa_zN$.

7. The electronic device of claim 1, wherein the first barrier material is adjacent to the heterogeneous semiconductive material, the first barrier material comprising a semiconductive material having a higher band gap than a band gap of the heterogeneous semiconductive material.

8. The electronic device of claim 1, wherein the first barrier material comprises a heterogeneous material varying in composition across a width thereof.

9. The electronic device of claim 1, further comprising a second barrier material on sidewalls of the heterogeneous semiconductive material opposite the first barrier material.

10. The electronic device of claim 9, wherein the second barrier material comprises a heterogeneous material varying in composition across a width thereof.

11. An electronic system, comprising:
a processor operably coupled to an input device and an output device; and
an electronic device operably coupled to the processor and comprising an array of vertical memory cells positioned along respective vertical channels extending vertically through a stack of conductive gate materials and dielectric materials and an underlying substrate to define vertical memory strings, each vertical channel comprising:
a first plug material within each vertical channel, the first plug material separated from the vertical channel by a barrier material;
a second plug material above the first plug material and at least partially vertically overlapping an uppermost conductive gate material of the stack of conductive gate materials and dielectric materials; and
a channel material within each vertical channel and on the first plug material, the channel material comprising a single material varying in composition and exhibiting a compositional gradient across a width thereof within the vertical channel.

12. The electronic system of claim 11, wherein the channel material comprises a single semiconductive material comprising two or more elements and exhibiting a compositional gradient of the two or more elements across the width thereof.

13. The electronic system of claim 11, wherein each vertical memory cell comprises the barrier material on a first side of the channel material and the barrier material on a second side of the channel material opposite the first side within the vertical channel, the barrier material extending an entire length of the vertical channel.

14. The electronic system of claim 13, wherein the harrier material comprises a semiconductive material having a higher band gap than a band gap of the channel material.

15. The electronic system of claim 11, wherein the channel material comprises one or more of a metal nitride-containing material, a metal oxide-containing material, and an indium antimonide-containing material.

16. An electronic device, comprising:
an array of memory cells comprising a channel material laterally proximate to tiers of alternating conductive materials and dielectric materials, the channel material comprising a semiconductive material having a first band gap;
at least one barrier material extending vertically along sidewalls of the channel material, the at least one barrier material comprising a heterogeneous semiconductive material varying in composition across a width thereof, wherein the heterogeneous semiconductive material has a second band gap different from the first band gap and the second band gap is about 1 eV greater than the first band gap;
a first plug material below the channel material, the first plug material laterally extending between opposing portions of the at least one barrier material; and
a second plug material above the first plug material and at least partially vertically overlapping an uppermost conductive material of the tiers of alternating conductive materials and dielectric materials.

17. The electronic device of claim 16, wherein the heterogeneous semiconductive material comprises a heterogeneous structure comprising two or more different materials that each individually exhibit a substantially homogeneous composition.

18. The electronic device of claim 16, wherein the heterogeneous semiconductive material comprises a single semiconductive material comprising two or more elements, wherein atomic concentrations of the two or more elements of the single semiconductive material vary across the width of the heterogeneous semi conductive material.

19. The electronic device of claim 16, wherein the semiconductive material of the channel material and the heterogeneous semiconductive material of the at least one barrier material comprise semiconductive materials having at least one element common therebetween.

20. The electronic device of claim 19, wherein each of the semiconductive material of the channel material and the heterogeneous semiconductive material of the at least one barrier material comprises one of a nitride-containing material, an oxide-containing material or an indium antimonide-containing material.

21. A method of forming an electronic device, comprising:
forming vertical openings extending through tiers of alternating conductive materials and dielectric materials of an array of memory cells;
forming another dielectric material within the vertical openings, the another dielectric material in contact with the tiers;

forming a channel material within the vertical openings and laterally proximate to the tiers, the channel material comprising a heterogeneous semiconductive material varying in composition across a width thereof, and the channel material comprising a semiconductive material having a first band gap;

forming a first barrier material on and in contact with opposing sidewalls of the another dielectric material within the vertical openings and adjacent to at least one vertical sidewall of the channel material, the first barrier material comprising a delta-doped heterogeneous aluminum gallium nitride or delta-doped aluminum gallium oxide material varying in composition across a width thereof, wherein the delta-doped heterogeneous aluminum gallium nitride or aluminum gallium oxide material has a second band gap different from the first band gap and the second band gap is about 1 eV greater than the first band gap; and forming a plug material below the channel material and interposed between portions of the first barrier material on opposing vertical sidewalls of the another dielectric material.

22. The method of claim 21, wherein forming the first barrier material comprises forming the first barrier material by atomic layer deposition.

23. The method of claim 21, further comprising forming a second barrier material on vertical sidewalls of the channel material opposite the first barrier material.

24. A method of forming an electronic device, comprising:

forming vertical openings extending through tiers of alternating conductive gate materials and dielectric materials of an array of memory cells comprising a channel material laterally proximate to the tiers, the channel material comprising a semiconductive material having a first band gap;

forming at least one barrier material on opposing sidewalls of another dielectric material in contact with the tiers of alternating conductive gate materials and dielectric materials, the at least one barrier material comprising a heterogeneous semiconductive material varying in composition across a width thereof, wherein the heterogeneous semiconductive material of the at least one barrier material has a second band gap different from the first band gap and the second band gap is about 1 eV greater than the first band gap;

forming a first plug material within the vertical openings and below the channel material, the first plug material laterally extending between opposing portions of the at least one barrier material;

forming the channel material within the vertical openings and on the first plug material, the at least one barrier material extending vertically along sidewalls of the channel material; and forming a second plug material above the first plug material and at least partially vertically overlapping an uppermost conductive material of the tiers of alternating conductive gate materials and dielectric materials.

25. The method of claim 24, wherein forming the at least one barrier material comprises forming the at least one barrier material by atomic layer deposition.

26. The method of claim 25, wherein forming the at least one barrier material comprises forming the at least one barrier material comprising aluminum gallium nitride or aluminum gallium oxide.

27. The method of claim 24, wherein forming the channel material within the vertical openings comprises forming a heterogeneous semiconductive material by atomic layer deposition.

28. The method of claim 27, wherein forming the channel material within the vertical openings comprises forming a single semiconductive material comprising different atomic concentrations of elements as the heterogeneous semiconductive material.

29. The method of claim 27, wherein forming the channel material within the vertical openings comprises forming the heterogeneous semiconductive material comprising one or more of boron nitride, aluminum nitride, gallium nitride, indium nitride, gallium arsenide nitride, aluminum gallium nitride, indium gallium nitride, aluminum gallium arsenide nitride, indium gallium arsenide nitride, indium aluminum arsenide nitride, zinc oxide, indium oxide, tin oxide, cadmium oxide, gallium oxide, copper oxide, nickel oxide, titanium dioxide, hafnium, oxide, zirconium oxide, magnesium oxide, indium tin oxide, and indium antimonide.

* * * * *

UNITED STATES PATENT AND TRADEMARK OFFICE
CERTIFICATE OF CORRECTION

| | |
|---|---|
| PATENT NO. | : 11,758,716 B2 |
| APPLICATION NO. | : 16/555033 |
| DATED | : September 12, 2023 |
| INVENTOR(S) | : Adam W. Saxler |

It is certified that error appears in the above-identified patent and that said Letters Patent is hereby corrected as shown below:

In the Specification

| | | |
|---|---|---|
| Column 7, | Line 4, | change "of "x", "y", "z", and" to --of "x," "y," "z," and-- |
| Column 7, | Lines 11-12, | change "the semiconductor material 106 may" to --the channel material 116 may-- |

In the Claims

| | | | |
|---|---|---|---|
| Claim 14, | Column 20, | Line 10, | change "the harrier" to --the barrier-- |
| Claim 18, | Column 20, | Line 48, | change "heterogeneous semi conductive material." to --heterogeneous semiconductive material.-- |
| Claim 20, | Column 20, | Line 58, | change "material or an" to --material, or an-- |

Signed and Sealed this
Thirty-first Day of October, 2023

Katherine Kelly Vidal
*Director of the United States Patent and Trademark Office*